United States Patent
Natori et al.

(10) Patent No.: US 7,501,675 B2
(45) Date of Patent: Mar. 10, 2009

(54) SEMICONDUCTOR DEVICE AND METHOD OF MANUFACTURING THE SAME

(75) Inventors: Katsuaki Natori, Yokohama (JP); Soichi Yamazaki, Yokohama (JP); Koji Yamakawa, Tokyo (JP); Hiroyuki Kanaya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/107,890

(22) Filed: Apr. 18, 2005

(65) Prior Publication Data

US 2005/0230728 A1 Oct. 20, 2005

(30) Foreign Application Priority Data

Apr. 19, 2004 (JP) .............................. 2004-123371

(51) Int. Cl.
*H01L 27/108* (2006.01)
(52) U.S. Cl. ............................... 257/295; 257/E27.104; 257/E21.664; 438/3
(58) Field of Classification Search ................. 257/295, 257/E21.663, E29.104, E21.664
See application file for complete search history.

(56) References Cited

U.S. PATENT DOCUMENTS

| | | | | |
|---|---|---|---|---|
| 6,144,060 | A * | 11/2000 | Park et al. | 257/310 |
| 6,404,001 | B2 | 6/2002 | Koo et al. | |
| 6,589,886 | B2 * | 7/2003 | Kim et al. | 438/758 |
| 6,611,014 | B1 | 8/2003 | Kanaya et al. | |
| 6,638,775 | B1 * | 10/2003 | Kweon | 438/3 |
| 6,686,620 | B2 * | 2/2004 | An et al. | 257/301 |
| 6,717,197 | B2 * | 4/2004 | An | 257/295 |
| 2002/0109168 | A1 * | 8/2002 | Kim et al. | 257/295 |
| 2002/0155667 | A1 * | 10/2002 | Higuchi et al. | 438/295 |
| 2003/0089954 | A1 * | 5/2003 | Sashida | 257/369 |
| 2004/0005724 | A1 * | 1/2004 | Lee et al. | 438/3 |
| 2004/0009307 | A1 * | 1/2004 | Koh et al. | 427/569 |
| 2004/0057319 | A1 * | 3/2004 | Dimmler et al. | 365/226 |
| 2004/0164050 | A1 * | 8/2004 | Egger et al. | 216/58 |
| 2004/0195601 | A1 * | 10/2004 | Kumura et al. | 257/295 |

(Continued)

FOREIGN PATENT DOCUMENTS

JP 2000-124411 4/2000

(Continued)

OTHER PUBLICATIONS

Definition of the term "on" by The American Heritage Dictionary of the English Language. http://www.xreferplus.com/entry.jsp?xrefid=4114364.*

(Continued)

*Primary Examiner*—David Vu
*Assistant Examiner*—Earl N Taylor
(74) *Attorney, Agent, or Firm*—Finnegan, Henderson, Farabow, Garrett & Dunner, L.L.P.

(57) ABSTRACT

A semiconductor device according to an aspect of the present invention comprises a semiconductor substrate, a ferroelectric capacitor, a protective film and an auxiliary capacitor. The ferroelectric capacitor is provided above the semiconductor substrate and comprises an upper electrode, a lower electrode and a ferroelectric film interposed between the upper and lower electrodes. The protective film is formed, covering the ferroelectric capacitor. The auxiliary capacitor is provided in a circuit section peripheral to the ferroelectric capacitor and uses the protective film as capacitor insulating film.

17 Claims, 4 Drawing Sheets

U.S. PATENT DOCUMENTS

2005/0255663 A1    11/2005    Natori et al.

FOREIGN PATENT DOCUMENTS

| JP | 2001-36026 | 2/2001 |
|---|---|---|
| JP | 2002-43541 | 2/2002 |
| JP | 2002-343942 | 11/2002 |

OTHER PUBLICATIONS

Notice of Reasons for Rejection mailed by the Japanese Patent Office on Sep. 9, 2008, for Japanese Patent Application No. 2004-123371, and English-language translation thereof.

* cited by examiner

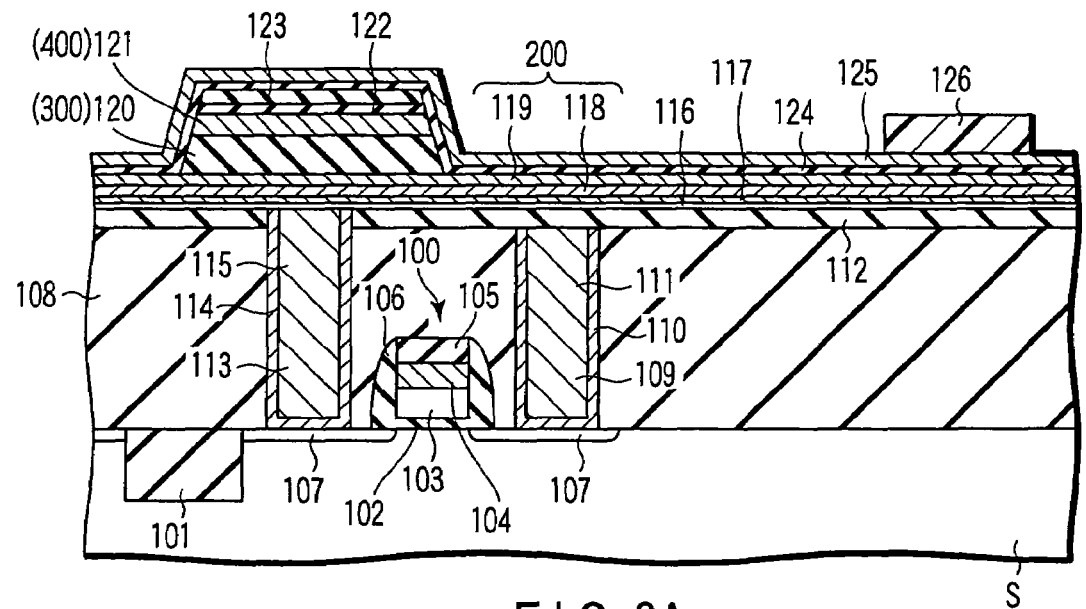
F I G. 2A
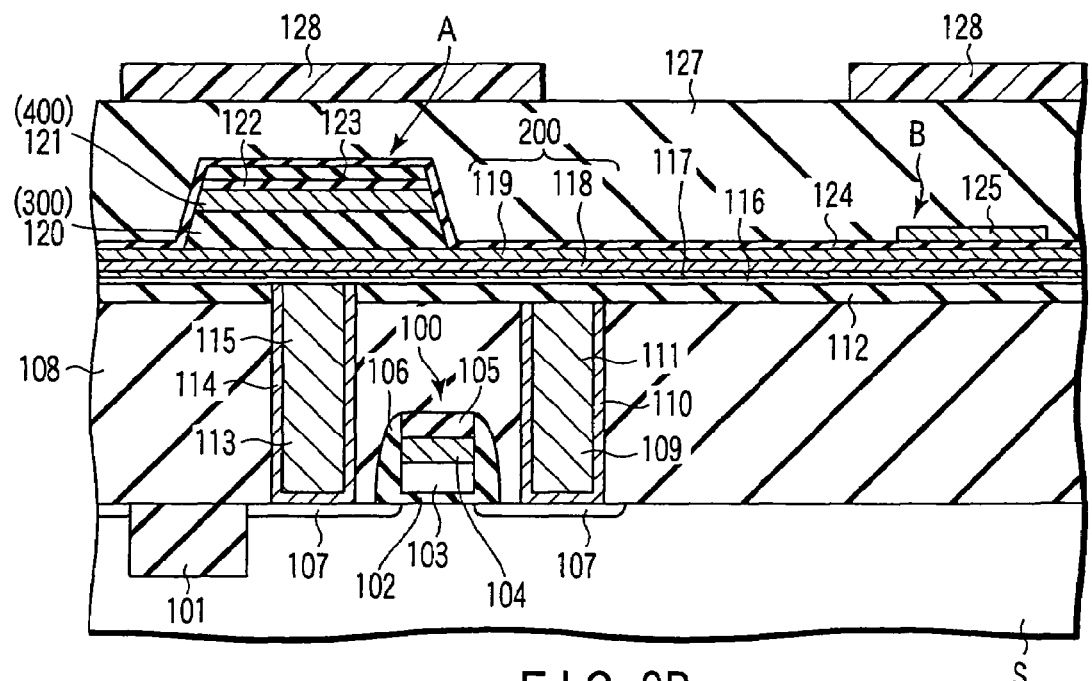
F I G. 2B under the patent number US 7,501,675 B2

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2004-123371, filed Apr. 19, 2004, the entire contents of which are incorporated herein by reference.

BACKGROUND OF THE INVENTION

1. Field of the Invention

The present invention relates to a semiconductor device and a method of manufacturing the same. More particularly, the invention relates to a semiconductor device having a capacitor using a dielectric and to a method of manufacturing this semiconductor device.

2. Description of the Related Art

Ferroelectric random access memories (FeRAMs) are non-volatile memories that have a ferroelectric thin film. They differ from DRAMs in that a ferroelectric is used in place of the capacitor section of the DRAM. They are expected to be the next-generation memories.

The FeRAM has a capacitor section that is a ferroelectric thin film made of PZT ($Pb(Zr_xTi_{1-x})O_3$), BIT ($Bi_4Ti_3O_{12}$), SBT ($SrBi_2Ta_2O_9$), or the like. These materials are of perovskite structure, the basic element of which is oxygen octahedron. Unlike Si oxide film that has been conventionally used, they do not exhibit ferroelectric property that characterizes them, so long as they remain amorphous. Hence, they cannot be used in amorphous state. To be used, they need to be crystallized by means of, for example, high-temperature heat treatment or high-temperature in-situ process. Generally, they must be processed at a temperature of at least 400 to 700° C. Note that the temperature depends on the material. MOCVD process, sputtering process, and chemical solution deposition (CSD) are available as methods of forming a film of any one of these materials.

The FeRAM capacitor having a member of such a ferroelectric material as described above exhibits good characteristics after the capacitor film has been formed. When a RIE process, an inter-layer film forming process, a wiring process, a sintering process, or a molding process is carried out thereafter, the capacitor may be damaged by diffusion of H or the like to have its characteristics degraded.

To lessen the damage to the capacitor during any process that follows the process of forming the capacitor film, a protective film is used. Jpn. Pat. Appln. KOKAI Publication No. 2001-36026 discloses a capacitor cell. The capacitor cell has an Al oxide film, which is a protective film provided on the top of the capacitor. The capacitor cell is therefore protected from damages. The Al oxide film may be formed by sputtering process, CVD process or the like. Jpn. Pat. Appln. KOKAI Publication No. 2002-43541 discloses an atomic layer deposition (ALD) method that realizes high step coverage in the micro-fabrication that achieves high integration density.

To enable the FeRAM to operate reliably, the circuits peripheral to the FeRAM have capacitors designed to stabilize the power. PZT capacitors are used, on trial basis, in the circuits peripheral to the FeRAM in order to stabilize the power. This is because PZT has high permittivity. Jpn. Pat. Appln. KOKAI Publication No. 2002-343942, for example, discloses a technique of forming ferroelectric capacitors in the memory-cell array region and forming, at the same time, dummy capacitors in the peripheral-circuit region. Further, U.S. Pat. No. 6,404,001 discloses a technique of forming ferroelectric capacitors for the memory cells, at the same time as the capacitors for the peripheral circuits. However, PZT capacitors have a large leakage current. This makes it difficult to reduce the thickness of the PZT capacitors for increasing the capacitance.

BRIEF SUMMARY OF THE INVENTION

According to an aspect of the present invention, there is provided a semiconductor device that comprises: a semiconductor substrate; a ferroelectric capacitor which is provided above the semiconductor substrate and which comprising an upper electrode, a lower electrode and a ferroelectric film interposed between the upper and lower electrodes; a protective film which is formed and which covers the ferroelectric capacitor; and an auxiliary capacitor which is provided in a circuit section peripheral to the ferroelectric capacitor and which uses the protective film as capacitor insulating film.

According to another aspect of this invention, there is provided a method of manufacturing a semi-conductor device. The method comprises: forming a ferroelectric capacitor by proving a lower electrode above a semiconductor substrate, providing a ferro-electric film on the lower electrode and providing an upper electrode on the ferroelectric film; forming a protective film, which covers the ferroelectric capacitor; and forming an auxiliary capacitor in a circuit section peripheral to the ferroelectric capacitor, by using the protective film as capacitor insulating film.

According to another aspect of this invention, there is provided a method of manufacturing a semiconductor device. The method comprises: forming a ferroelectric capacitor by providing a first film above a semiconductor substrate, providing a ferroelectric film on the first film and providing an upper electrode on the ferroelectric film; forming a protective film, which covers the ferroelectric capacitor; and forming an auxiliary capacitor in a circuit section peripheral to the ferroelectric capacitor, by using the first film as lower electrode and using the protective film as capacitor insulating film.

According to another aspect of this invention, there is provided a method of manufacturing a semiconductor device. The method comprises: forming a ferroelectric capacitor by providing a first lower electrode above a semiconductor substrate, providing a ferroelectric film on the first lower electrode and providing a first upper electrode on the ferroelectric film; forming a second lower electrode in a circuit section peripheral to the ferroelectric capacitor; forming a protective film, which covers the ferro-electric capacitor and the second lower electrode, and using the protective film above the second lower electrode as capacitor insulating film; and forming an auxiliary capacitor by providing a second upper electrode on the capacitor insulating film.

BRIEF DESCRIPTION OF THE SEVERAL VIEWS OF THE DRAWING

FIG. 2A is a sectional view, illustrating a process of manufacturing the FeRAM according to the first embodiment;

FIG. 2B is a sectional view, illustrating a process of manufacturing the FeRAM according to the first embodiment;

DETAILED DESCRIPTION OF THE INVENTION

Embodiments of this invention will be described, with reference to the accompanying drawings.

FIGS. 1A, 1B, 2A, 2B and 3 are sectional views, illustrating the process of manufacturing a FeRAM according to the first embodiment. The first embodiment is a COP-type FeRAM cell in which the plug member located below the capacitor is made of tungsten.

Figure 1A:
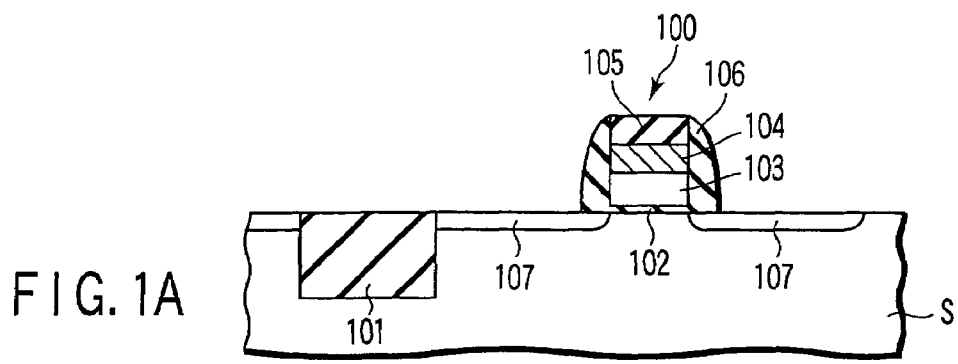
FIG. 1A is a sectional view, illustrating a process of manufacturing a FeRAM according to a first embodiment.

First, as shown in FIG. 1A, an element isolation trench is made in a region of a surface of a P-type Si substrate (semiconductor substrate) S, other than the transistor activation region, and is filled with SiO2, thereby forming an element isolation region 101. (That is, shallow trench isolation is carried out.) Then, a transistor that performs a switching operation is formed.

An oxide film 102 about 6 nm thick is formed on the entire surface of the Si substrate S by means of thermal oxidation. Then, an n$^+$-type polycrystalline silicon film 103 doped with arsenic is formed on the entire surface of the oxide film 102. Further, a WSi$_x$ film 104 is formed on the polycrystalline silicon film 103. A nitride film 105 is then formed on the WSi$_x$ film 104. Thereafter, the polycrystalline silicon film 103, WSi$_x$ film 104 and nitride film 105 are subjected to an ordinary photolithography and a RIE process. A gate electrode 100 is thereby formed.

Further, a nitride film 106 is deposited, and RIE is carried out, leaving the side walls. Thus, spacers are provided on the sides of the gate electrode 100. At the same time, source-drain regions 107 are formed by performing ion implantation and heat treatment, which are not described in detail.

Figure 1B:
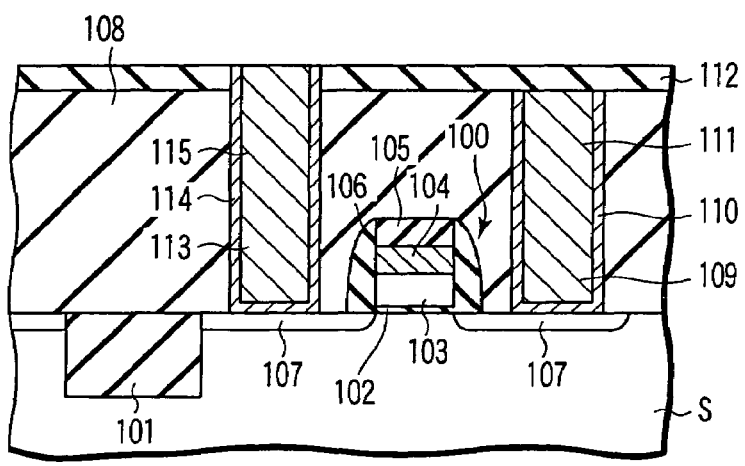
FIG. 1B is a sectional view, illustrating a process of manufacturing the FeRAM according to the first embodiment.

Next, as shown in FIG. 1B, a CVD oxide film 108 is deposited on the entire surface of the resultant structure. A CMP process is performed on the film 108. The film 108 therefore acquires a flat surface. A contact hole 109 is made, which reaches one of the source-drain regions 107 of the transistor. Then, a sputtering process or a CVD process is carried out, depositing a thin titanium film. The resultant structure is subjected to a heat treatment in an atmosphere of a forming gas, thus forming a TiN film 110. Subsequently, CVD tungsten 111 is deposited on the entire surface and in the contact hole 109. A CMP process is carried out, removing the tungsten 111 from the region outside the contact hole 109. Thus, the contact hole 109 is filled with tungsten 111.

Thereafter, a CVD nitride film 112 is deposited on the entire surface. Further, a contact hole 113 is made, which reaches the other of the source-drain region 107 of the transistor. A TiN film 114 is formed and tungsten 115 is filled in this contact hole, in the same way as in the first contact hole. A plug is thereby formed, which is connected to the capacitor.

Subsequently, as FIG. 2A depicts, a sputtering process is carried out, depositing a silicon carbide film 116, 10 nm thick, on the entire surface of the CVD nitride film 112. Then, a titanium film 117, about 3 nm thick, is deposited on the entire surface of silicon carbide film 116 by means of a sputtering process. Further, an iridium film 118 having a thickness of 30 nm and a first platinum film 119 having a thickness of 20 nm are formed on the entire surface of the titanium film 117, by means of a sputtering process. The films 118 and 119 will constitute the lower electrode 200 of the capacitor.

Another sputtering process is performed, forming a PZT film 120 on the first platinum film 119. The PZT film 120 will be the dielectric film 300 of the capacitor. The entire structure is once subjected to a rapid thermal anneal (RTA) in an oxygen atmosphere, thus crystallizing the PZT film 120. Then, a sputtering process is performed, forming a second platinum film 121 on the PZT film 120. The second platinum film 121 will be the upper electrode 400 of the capacitor.

Thereafter, a sputtering process is carried out, forming an Al$_2$O$_3$ film on the second platinum film 121. The Al$_2$O$_3$ film is 5 nm thick and is used as first protective film 122. Then, a CVD oxide film 123, which is used as a process mask, is deposited on the first protective film 122. The CVD oxide film 123 is patterned by means of photolithography and a RIE process using a photoresist. After the photoresist is removed, the first protective film 122, second platinum film 121 and PZT film 120 are etched by means of a RIE process.

Next, an ALD method is performed, thereby forming an Al$_2$O$_3$ film, or second protective film 124, on the entire surface. The film 124 is formed at a temperature of 200° C. to a thickness of 10 nm. In this case, the second protective film 124 contacts the upper surface of the fist platinum film 119 that will be the lower electrode 200 of the capacitor. Then, a sputtering process is performed, forming a TiN film 125 on the second protective film 124. The TiN film 125 will be the upper electrode of a power-stabilizing capacitor (or auxiliary capacitor) provided in a peripheral-circuit section. The TiN film 125 is 50 nm thick. The TiN film 125 is subjected to photolithography and a RIE process using a resist mask 126. The upper electrode of the power-stabilizing capacitor in the peripheral-circuit section is thereby formed.

Subsequently, a CVD oxide film 127 is deposited on the entire surface as is illustrated in FIG. 2B. The CVD oxide film 127 is a process mask that will be used to process the lower electrode of the capacitor A and the lower electrode of the power-stabilizing capacitor B provided in the peripheral-circuit section. Photolithography using a resist mask 128 is performed in combination with a RIE process, thus processing the CVD oxide film 127. Using this oxide film as a mask, the second protective film 124, first platinum film 119, iridium film 118, titanium film 117 and silicon carbide film 116 are sequentially patterned, in the order they are mentioned. Thus, the ferroelectric capacitor A and the power-stabilizing capacitor B of the peripheral-circuit section are manufactured.

Figure 3:
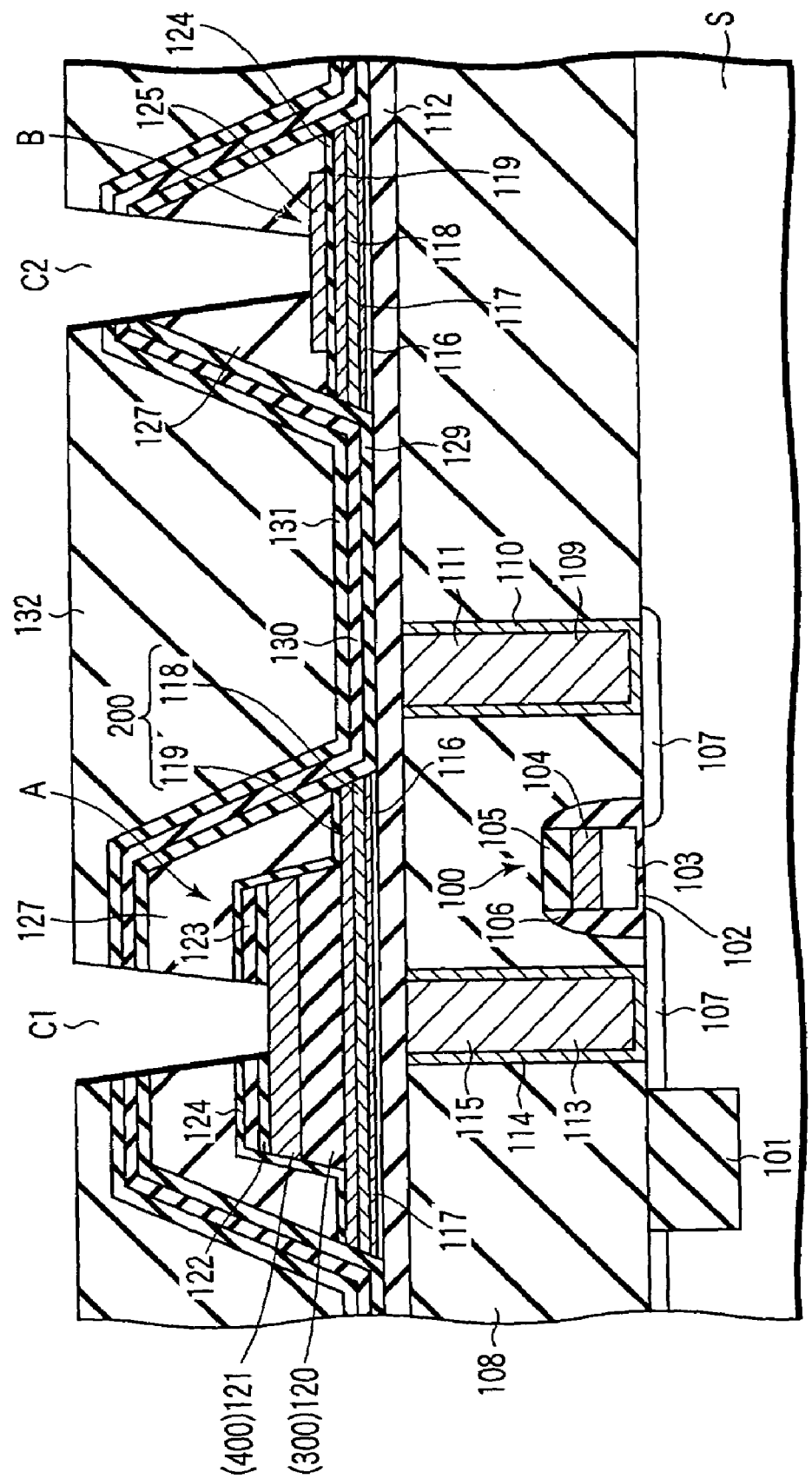
FIG. 3 is a sectional view, illustrating a process of manufacturing the FeRAM according to the first embodiment.

Thereafter, an ALD method is carried out, forming an Al$_2$O$_3$ film on the entire surface as depicted in FIG. 3. This Al$_2$O$_3$ film is a third protective film 129, formed at 200° C. and having a thickness of 10 nm. Then, another ALD method is performed, depositing a CVD oxide film 130, 50 nm thick, on the third protective film 129. Another Al$_2$O$_3$ film, or a fourth protective film 131, is then formed on the CVD oxide film 130. The fourth protective film 131 is formed at 200° C. and 10 nm thick.

Next, a CVD oxide film 132 is deposited on the entire surface, covering the ferroelectric capacitor A and the power-stabilizing capacitor B of the peripheral-circuit section. A CMP process is performed on the film 132, which acquires a flat surface. Then, photolithography and a RIE process are carried out, thus patterning the CVD oxide film 132. Further, contact holes C1 and C2 are made, which respectively reach the second platinum film 121 of the ferroelectric capacitor A and the TiN film 125 of the power-stabilizing capacitor B provided in the peripheral-circuit section. The resultant structure is heat-treated at about 600° C. in an oxygen atmosphere in order to nullify the damages done to the PZT film 120 during the processing.

Thereafter, drive lines and bit lines are formed, though not shown. Further, metal wiring is carried out for the upper layers. Thus, the manufacture of a FeRAM is completed.

Figure 4:
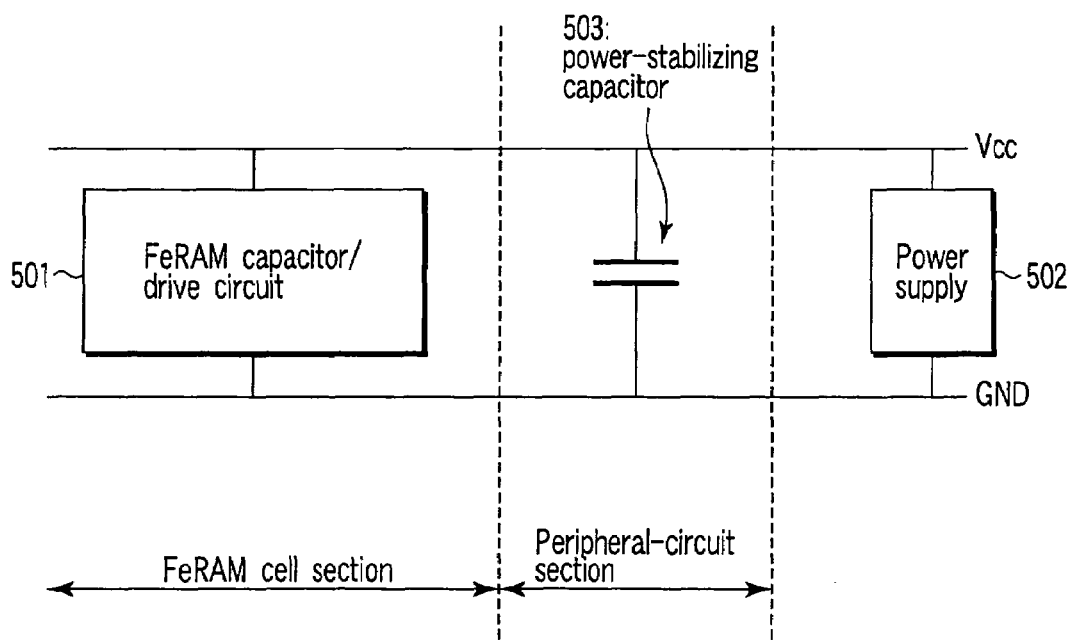
FIG. 4 is a diagram showing the role of a power-stabilizing capacitor for use in the first embodiment.

The role that the power-stabilizing capacitor plays will be described, with reference to FIG. 4. The FeRAM cell section comprises a FeRAM capacitor and a drive circuit (hereinafter referred to as "FeRAM cell unit") 501. Power is supplied to the FeRAM cell unit 501 from a power supply 502. A power-stabilizing capacitor 503 must be connected in parallel between the power supply 502 and the FeRAM cell unit 501 in a hybrid device for use in cards. This is because it would be otherwise difficult to provide a stable power supply due to the limited area. This is also because the data recorded in the FeRAM cell unit 501 needs to be protected against the interruption of the supply of power from an external device, which may occur when the FeRAM cell unit 501 is erroneously operated.

In the first embodiment, the insulating film for the power-stabilizing capacitor B is the $Al_2O_3$ film that is used as second protective film 124 of the ferroelectric capacitor A. The power-stabilizing capacitor can therefore be made to have a sufficient capacitance, without performing extra manufacturing steps.

Although the second protective film 124 (i.e., $Al_2O_3$ film) of the ferroelectric capacitor A is used as insulating film in the power-stabilizing capacitor B of the peripheral-circuit section, any one of the first to fourth protective films 122, 124, 129 and 131 may be used as that insulating film by properly changing the processes. In the first embodiment, the lower electrode of the ferroelectric capacitor and the lower electrode of the capacitor provided in the peripheral-circuit section are made of the same materials (118 and 119). Instead, the lower electrode of the capacitor in the peripheral-circuit section may be made separately from the lower electrode of the ferroelectric capacitor and a protective film may then be deposited on these electrodes and used as an insulating film of the capacitor in the peripheral-circuit section. The capacitor of the peripheral-circuit section can be thus formed.

Figure 5A:
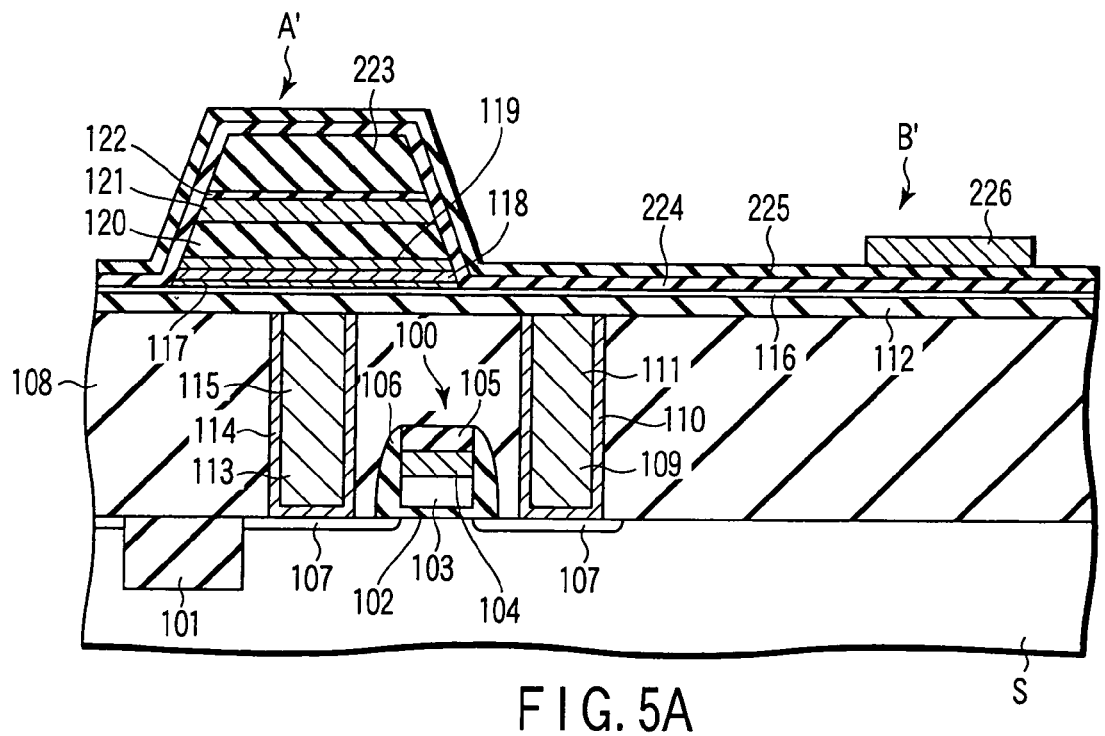
FIG. 5A is a sectional view, illustrating a process of manufacturing a FeRAM according to a second embodiment.
Figure 5B:
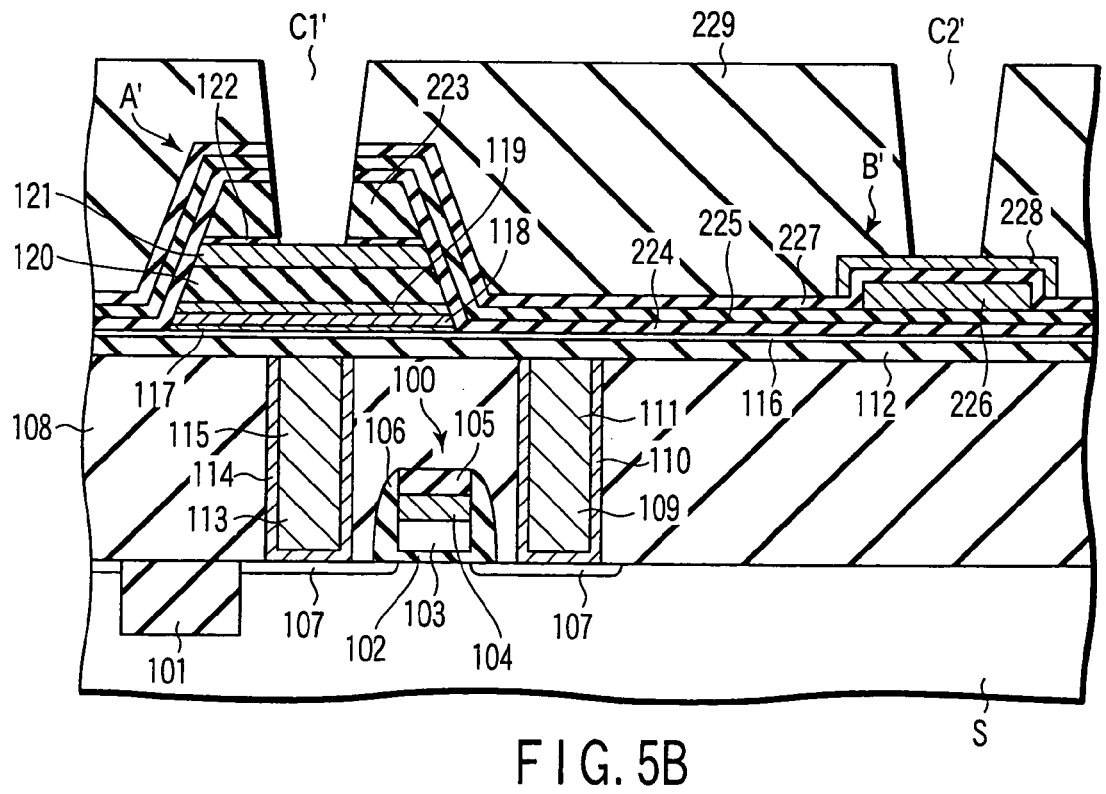
FIG. 5B is a sectional view, illustrating a process of manufacturing the FeRAM according to the second embodiment.

FIGS. 5A and 5B are sectional views illustrating a process of manufacturing a FeRAM according to the second embodiment. In the second embodiment, a FeRAM capacitor is formed by performing etching only one time.

In the second embodiment, the sequence of steps of forming the transistor, plug and FeRAM capacitor (connected to the plug) is the same as the sequence of steps performed in the first embodiment.

After forming the transistor, plug and FeRAM capacitor, a CVD oxide film 223, which is used as a process mask, is formed on the first protective film 122 as is illustrated in FIG. 5A. The CVD oxide film 223 is patterned by means of photolithography and a RIE process using a photoresist. After the photoresist is removed, the first protective film 122, second platinum film 121, PZT film 120, first platinum film 119, iridium film 118, titanium film 117 and silicon carbide film 116 are etched by means of a RIE process. A ferroelectric capacitor A' is thereby formed.

Next, an ALD method is carried out, forming an $Al_2O_3$ film on the entire surface of the resultant structure, which is used as second protective film 224. The film 224 is formed at 200° C. and is 10 nm thick. Then, a CVD oxide film 225 of 50 nm thick is deposited on the second protective film 224. Subsequently, a sputtering process is performed, forming a TiN film, which will be the lower electrode of the power-stabilizing capacitor B' of a peripheral-circuit section. The TiN film is 50 nm thick. Photolithography is performed in combination with a RIE process, thus patterning the TiN film. The lower electrode 226 of the power-stabilizing capacitor B' of a peripheral-circuit section is thereby formed.

Then, an ALD method is carried out, forming an $Al_2O_3$ film, or the third protective film 227, on the entire surface as shown in FIG. 5B. The film 227 is formed at 200° C. and 10 nm thick. Further, a sputtering process is performed, forming a TiAlN film. The TiAlN film is 50 nm thick and will be the upper electrode of the power-stabilizing capacitor B' of the peripheral-circuit section. Next, photolithography is performed in combination with a RIE process, thus patterning the TiAlN film. The upper electrode 228 is thereby formed.

Next, a CVD oxide film 229 is deposited on the entire surface, covering the ferroelectric capacitor A' and the power-stabilizing capacitor B' of the peripheral-circuit section. A CMP process is performed on the film 229, which acquires a flat surface. Then, photolithography and a RIE process are carried out, patterning the CVD oxide film 229. Contact holes C1' and C2' are then made, which respectively reach the second platinum film 121 of the ferroelectric capacitor A' and the upper electrode 228 of the power-stabilizing capacitor provided in the peripheral-circuit section. The resultant structure is heat-treated at about 600° C. for about 1 hour in an oxygen atmosphere in order to nullify the damages done to the PZT film 120 during the processing.

Thereafter, drive lines and bit lines are formed, though not shown. Further, metal wiring is carried out for the upper layers. Thus, the manufacture of a FeRAM is completed.

In the second embodiment, the FeRAM capacitor can be formed by carrying out etching only once. Further, the insulating film for the power-stabilizing capacitor B' is the $Al_2O_3$ film that is used as third protective film 227 of the ferroelectric capacitor A'. Thus, the third protective film of the ferroelectric capacitor A' is connected to the insulating film of the power-stabilizing capacitor B' provided in the peripheral-circuit section. Hence, the power-stabilizing capacitor can therefore be made to have a sufficient capacitance, without performing extra manufacturing steps.

In each of the embodiments described above, the ferroelectric film of the FeRAM capacitor is made of PZT, and the upper and lower electrodes of the FeRAM capacitor are made of platinum. The ferroelectric film and the upper and lower electrodes may be made of other materials, nevertheless. The ferroelectric film may be made of, for example, SBT. The electrodes may be made of iridium, ruthenium or a compound conductor such as strontium oxide. Moreover, the shape of the capacitor provided in the peripheral-circuit section is not limited to a planer one. Rather, this capacitor may be a cube, in which case the capacitance of the capacitor can increase.

Each of the embodiments described above provides a device and a method of manufacturing the device, which provide a power-stabilizing capacitor of a sufficient capacitance in a peripheral circuit that is incorporated in a device configuration using protective films for the purpose of avoiding or lessening damages that a capacitor process, such as RIE process or plasma CVD process, may cause in the manufacture of an FeRAM or a DRAM having ferroelectric capacitors.

Al oxide film can work as an anti-hydrogen barrier. It is an effective protective film that prevents the characteristics of capacitors from degrading during the RIE process, plasma CVD process or sintering process. Al oxide films are formed by sputtering in most cases. The FeRAM capacitor has a taper angle of about 60° at either side if the integration density is about 1 M. If the integration density is higher, making the capacitor smaller, the taper angle at either side will be 85° or more. If the taper angle is so large, it will be difficult for the sputtering process to deposit an Al oxide film on either side of the capacitor. On the other hand, forming an Al oxide film formed by the CVD process has high step coverage. In particular, the atomic layer deposition (ALD) process excels in forming films with step coverage and in controlling the thickness of such films.

Al oxide film exhibits high permittivity and is an effective capacitor insulating film. Particularly, the Al oxide film formed by the ALD (CVD) process has prominent insulating property and can serve to provide capacitors having a larger capacitance. If an Al oxide film is used in the power-stabilizing capacitor of the peripheral-circuit section, the capacitor can have a large capacitance. Usually, the power-stabilizing capacitor is made, independent of the ferroelectric capacitor. Nonetheless, it can be fabricated without performing extra manufacturing steps, thanks to the use of the protective films of the ferroelectric capacitor that are being formed. Furthermore, the number of manufacturing steps will decrease if the lower electrode of the power-stabilizing capacitor is made of the same film as the lower electrode of the ferroelectric capacitor.

The embodiments can provide a power-stabilizing capacitor of good electrical characteristics, because the protective films provided in a FeRAM having ferroelectric capacitors are used as the insulating films of the power-stabilizing capacitor in the area of the peripheral-circuit. Further, they can provide not only a FeRAM, but also any other semiconductor device, such as a DRAM having ferroelectric capacitors, which needs to have an H barrier film and which includes excellent power-stabilizing capacitors. In other words, the embodiments can provide capacitors for supplying stabilized power, by using the protective films of the capacitors of an FeRAM as the insulating films of the capacitors provided in the circuits that are peripheral to the FeRAM and. Hence, the embodiments can provide a FeRAM that is small and has a high integration density by performing a small number of manufacturing steps.

The embodiments can provide a semiconductor device that has ferroelectric capacitors and that can be made in a small number of steps and has auxiliary capacitors of good electrical characteristics formed in the circuit sections peripheral to the ferroelectric capacitors, and can provide a method of manufacturing this semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a ferroelectric capacitor which is provided above the semiconductor substrate and which comprises a first upper electrode, a first lower electrode and a ferroelectric film interposed between the first upper and first lower electrodes;
   a protective film which is formed, covering the ferroelectric capacitor, and which includes an Al oxide film; and
   an auxiliary capacitor which is provided in a circuit section peripheral to the ferroelectric capacitor, which comprises a second lower electrode and a second upper electrode, and which uses the protective film as capacitor insulating film, the protective film being interposed between the second lower and second upper electrodes,
   wherein the Al oxide film contacts at least one of an upper surface of the second lower electrode and a lower surface of the second upper electrode.

2. The semiconductor device according to claim 1, wherein the protective film of the ferroelectric capacitor and the capacitor insulating film of the auxiliary capacitor are connected to each other.

3. The semiconductor device according to claim 1, wherein the first lower electrode of the ferroelectric capacitor and the second lower electrode of the auxiliary capacitor are made of the same material.

4. The semiconductor device according to claim 1, wherein the ferroelectric film is made of PZT.

5. The semiconductor device according to claim 1, wherein the first lower electrode and first upper electrode are made of platinum.

6. A method of manufacturing a semiconductor device, comprising:
   forming a ferroelectric capacitor by providing a first lower electrode above a semiconductor substrate, providing a ferroelectric film on the first lower electrode and providing a first upper electrode on the ferroelectric film;
   forming a protective film, which covers the ferroelectric capacitor, and includes an Al oxide film; and
   forming an auxiliary capacitor in a circuit section peripheral to the ferroelectric capacitor, by providing a second lower electrode above the semiconductor substrate, providing the protective film as capacitor insulating film on the second lower electrode and providing a second upper electrode on the protective film, the protective film being interposed between the second lower electrode and the second upper electrode,
   wherein the Al oxide film contacts at least one of an upper surface of the second lower electrode and a lower surface of the second upper electrode.

7. The method of manufacturing a semiconductor device, according to claim 6, wherein the protective film is formed by an ALD method.

8. A method of manufacturing a semiconductor device, comprising:
   forming a ferroelectric capacitor by providing a first film above a semiconductor substrate, providing a ferroelectric film on the first film and providing a first upper electrode on the ferroelectric film;
   forming a protective film, which covers the ferroelectric capacitor and includes an Al oxide film; and
   forming an auxiliary capacitor in a circuit section peripheral to the ferroelectric capacitor by using the first film as lower electrode, using the protective film as capacitor insulating film and providing a second upper electrode on the protective film, the protective film being interposed between the first film and the second upper electrode,
   wherein the Al oxide film contacts at least one of an upper surface of the lower electrode and a lower surface of the second upper electrode.

9. The method of manufacturing a semiconductor device, according to claim 8, wherein the protective film is formed by an ALD method.

10. A method of manufacturing a semiconductor device, comprising:
    forming a ferroelectric capacitor by providing a first lower electrode above a semiconductor substrate, providing a ferroelectric film on the first lower electrode and providing a first upper electrode on the ferroelectric film;
    forming a second lower electrode in a circuit section peripheral to the ferroelectric capacitor;

forming a first protective film, an oxide film, and a second protective film to cover the ferroelectric capacitor, wherein the second protective film includes an Al oxide film which contacts an upper surface of the second lower electrode, the first protective film and oxide film are provided on an opposite side of the second lower electrode, and the second protective film is a capacitor insulating film; and forming an auxiliary capacitor by providing a second upper electrode, a lower surface of the second upper electrode contacting the Al oxide film.

11. The method of manufacturing a semiconductor device, according to claim 10, wherein the second protective film is formed by an ALD method.

12. The semiconductor device according to claim 1, wherein the auxiliary capacitor does not overlap with the ferroelectric capacitor when viewed from above.

13. The semiconductor device according to claim 12, wherein the auxiliary capacitor and the ferroelectric capacitor are substantially on the same level.

14. A semiconductor device comprising:
a semiconductor substrate;
a ferroelectric capacitor which is provided above the semiconductor substrate and which comprises a first upper electrode, a first lower electrode, and a ferroelectric film interposed between the first upper and first lower electrodes;

a first protective film, an oxide film, and a second protective film which are formed, covering the ferroelectric capacitor, the second protective film including an Al oxide film; and an auxiliary capacitor which is provided in a circuit section peripheral to the ferroelectric capacitor and provided above the first protective film, which comprises a second lower electrode and a second upper electrode, and which uses the second protective film as a capacitor insulating film, the second protective film being interposed between the second lower and second upper electrodes, wherein the Al oxide film contacts at least one of an upper surface of the second lower electrode and a lower surface of the second upper electrode, and the first protective film and oxide film are provided on an opposite side of the second lower electrode.

15. The semiconductor device according to claim 14, wherein the first protective film is formed to cover a top surface and side surface of the ferroelectric capacitor.

16. The semiconductor device according to claim 6, wherein the protective film contacts an upper surface of the first lower electrode of the ferroelectric capacitor.

17. The semiconductor device according to claim 1, wherein the protective film contacts an upper surface of the first lower electrode of the ferroelectric capacitor.

* * * * *